(12) United States Patent
Beau et al.

(10) Patent No.: US 12,745,353 B2
(45) Date of Patent: Sep. 22, 2026

(54) METHOD FOR ASSEMBLING A DISPLAY DEVICE

(71) Applicant: Faurecia Clarion Electronics Europe, Paris (FR)

(72) Inventors: Godefroy Beau, La Garenne Colombes (FR); Romain Feilleux, Epinay sur Seine (FR)

(73) Assignee: Faurecia Clarion Electronics Europe, Paris (FR)

( * ) Notice: Subject to any disclaimer, the term of this patent is extended or adjusted under 35 U.S.C. 154(b) by 284 days.

(21) Appl. No.: 18/441,860

(22) Filed: Feb. 14, 2024

(65) Prior Publication Data

US 2024/0276657 A1 Aug. 15, 2024

(30) Foreign Application Priority Data

Feb. 15, 2023 (FR) ..................................... 23 01402

(51) Int. Cl.

*H05K 7/20* (2006.01)
*B29C 65/70* (2006.01)
*H05K 5/02* (2006.01)
*B29K 105/00* (2006.01)
*B29L 31/34* (2006.01)

(52) U.S. Cl.

CPC ........... *H05K 5/0213* (2013.01); *B29C 65/70* (2013.01); *H05K 5/0217* (2013.01); *B29K 2105/0097* (2013.01); *B29L 2031/3475* (2013.01)

(58) Field of Classification Search

CPC ....... H05K 5/02; H05K 5/0213; H05K 5/0217
See application file for complete search history.

(56) References Cited

U.S. PATENT DOCUMENTS 6,104,457 A 8/2000 Izumi et al.
11,006,533 B2 * 5/2021 Floch ..................... B60K 35/50
2011/0092126 A1 * 4/2011 Tomono .................. H01J 9/241 445/25
2012/0081874 A1 * 4/2012 Wu ....................... G02F 1/1333 361/679.01
2021/0333916 A1 * 10/2021 Wu ......................... G06F 3/041

FOREIGN PATENT DOCUMENTS

CN 113414071 B 11/2021
CN 109739393 B 2/2022
FR 3092929 A1 8/2020

OTHER PUBLICATIONS

French Search Report corresponding to application FR2301402, Sep. 8, 2023, 2 pages.

* cited by examiner

*Primary Examiner* — Anthony Q Edwards
(74) *Attorney, Agent, or Firm* — Reising Ethington P.C.

(57) ABSTRACT

A method for assembling a display device that includes the following successive steps: assembling a screen having a display face with a seal, thereby forming a central assembly; attaching a frame with a lens, thereby forming a front assembly; assembling the central assembly with the front assembly, the seal maintaining a sealed connection between the lens and the screen and forming a spacer maintaining a space between the screen and the lens. The seal includes at least one injection opening having an internal orifice opening into the space and an external orifice adapted to receive an injector tip of a transparent adhesive. The method includes injecting the transparent adhesive into the space via the injection opening.

10 Claims, 7 Drawing Sheets

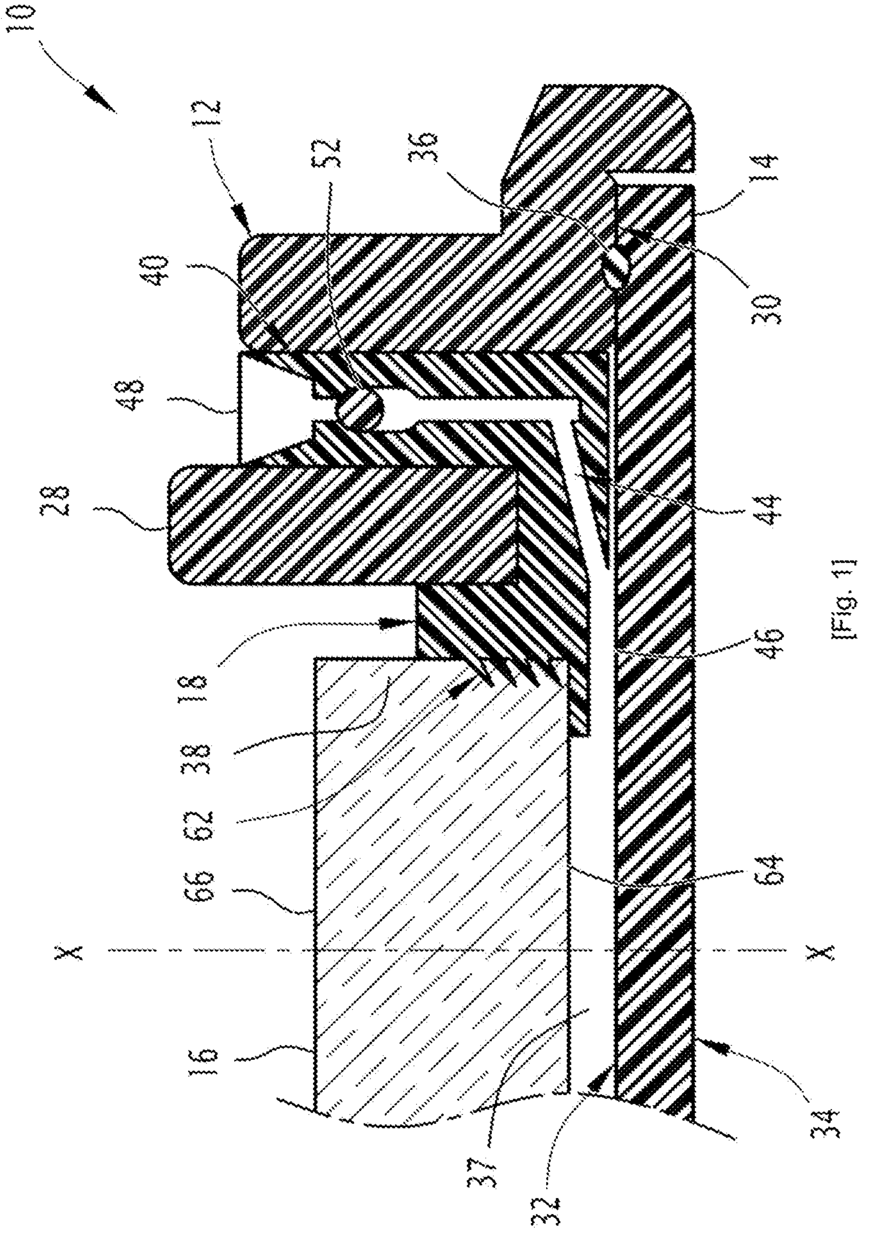
[Fig. 1]

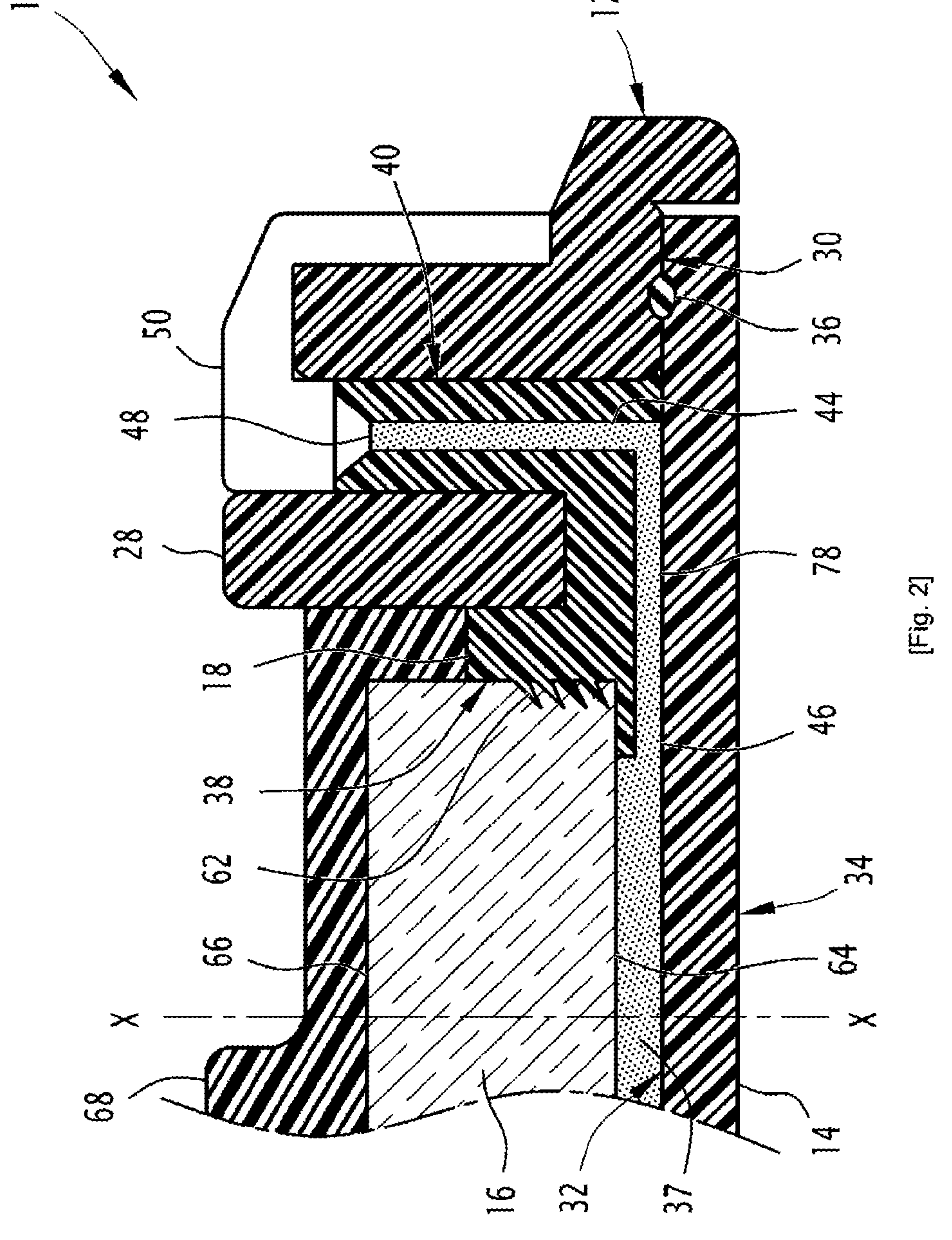
[Fig. 2]

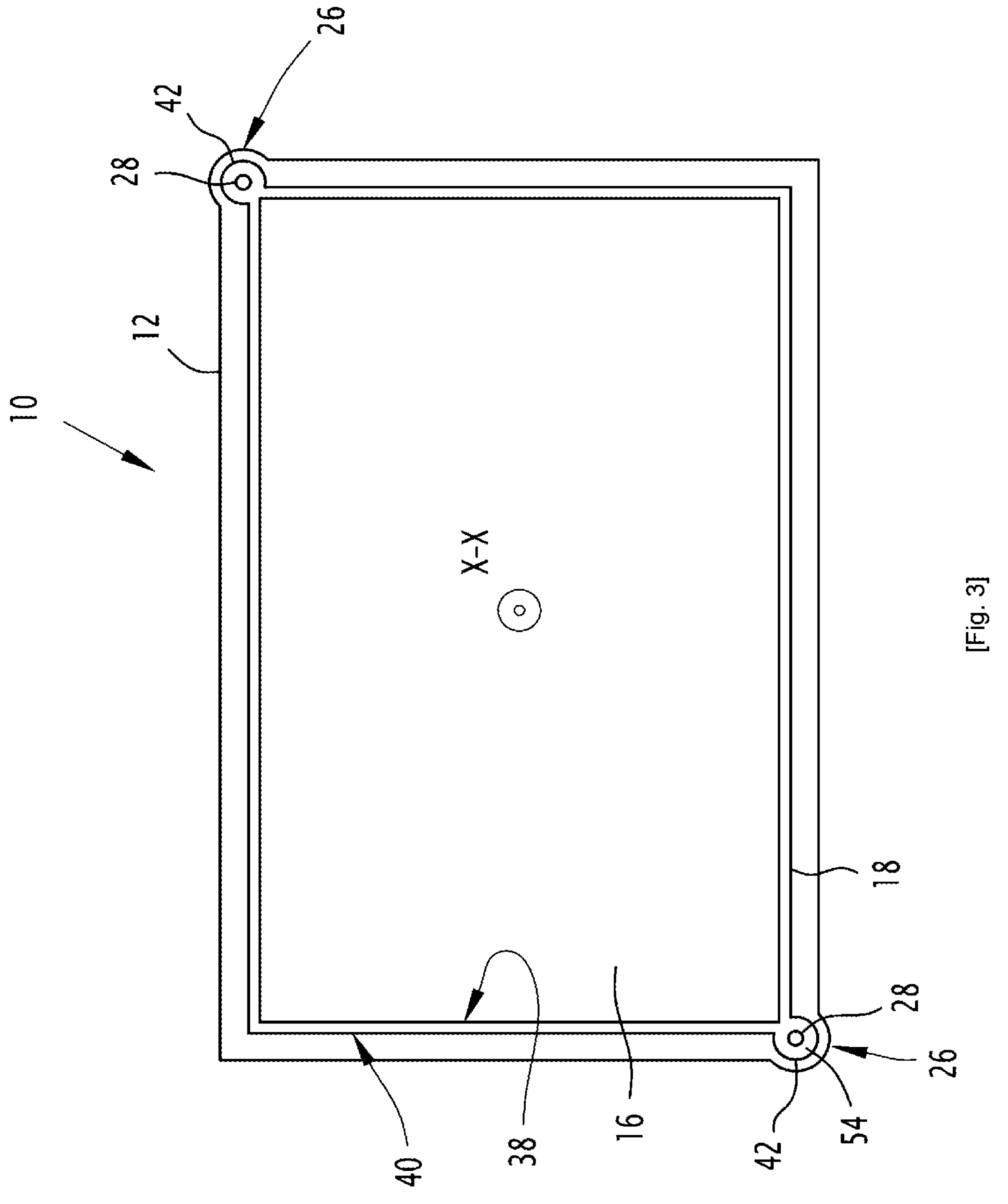
[Fig. 3]

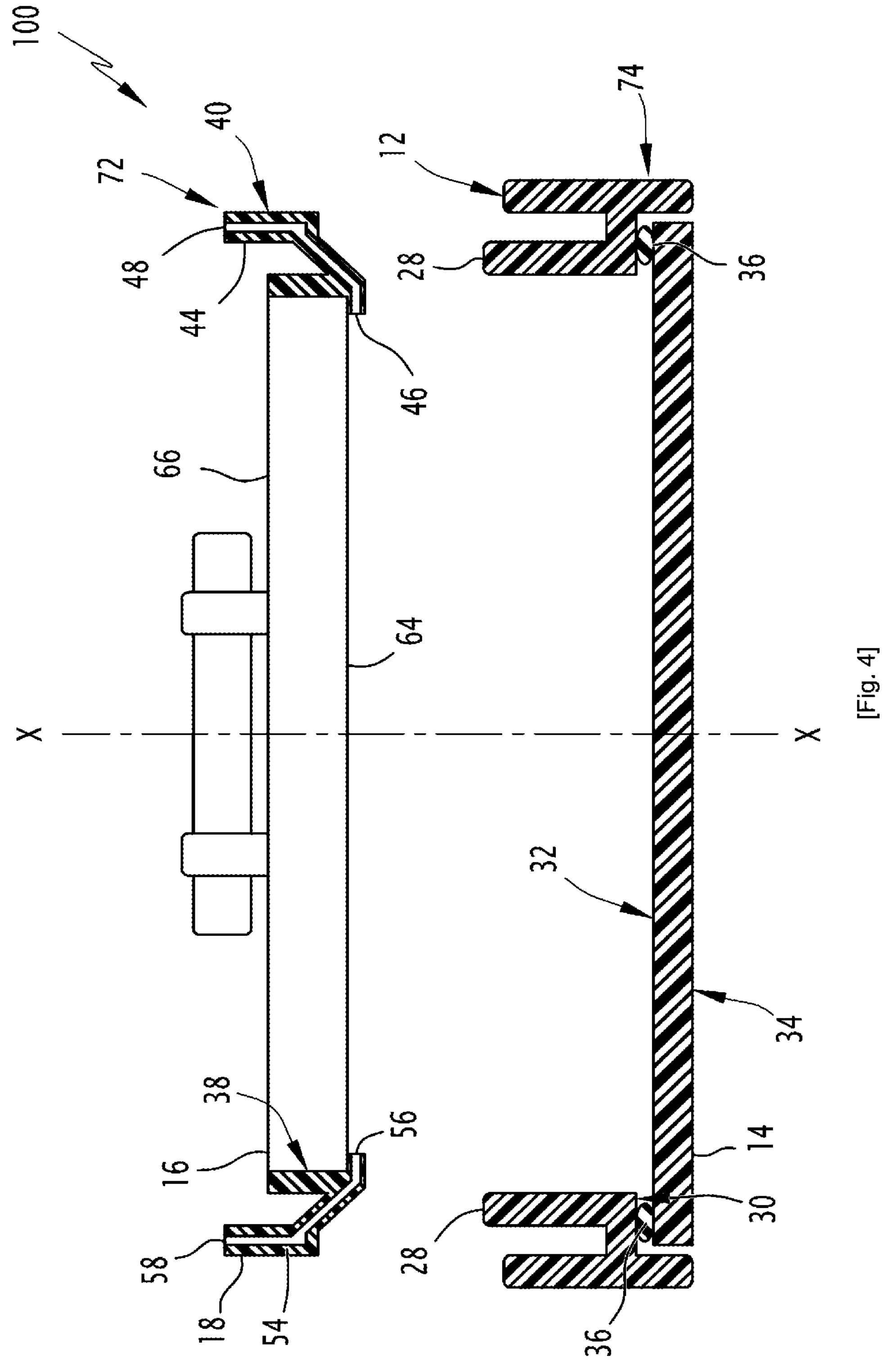
[Fig. 4]

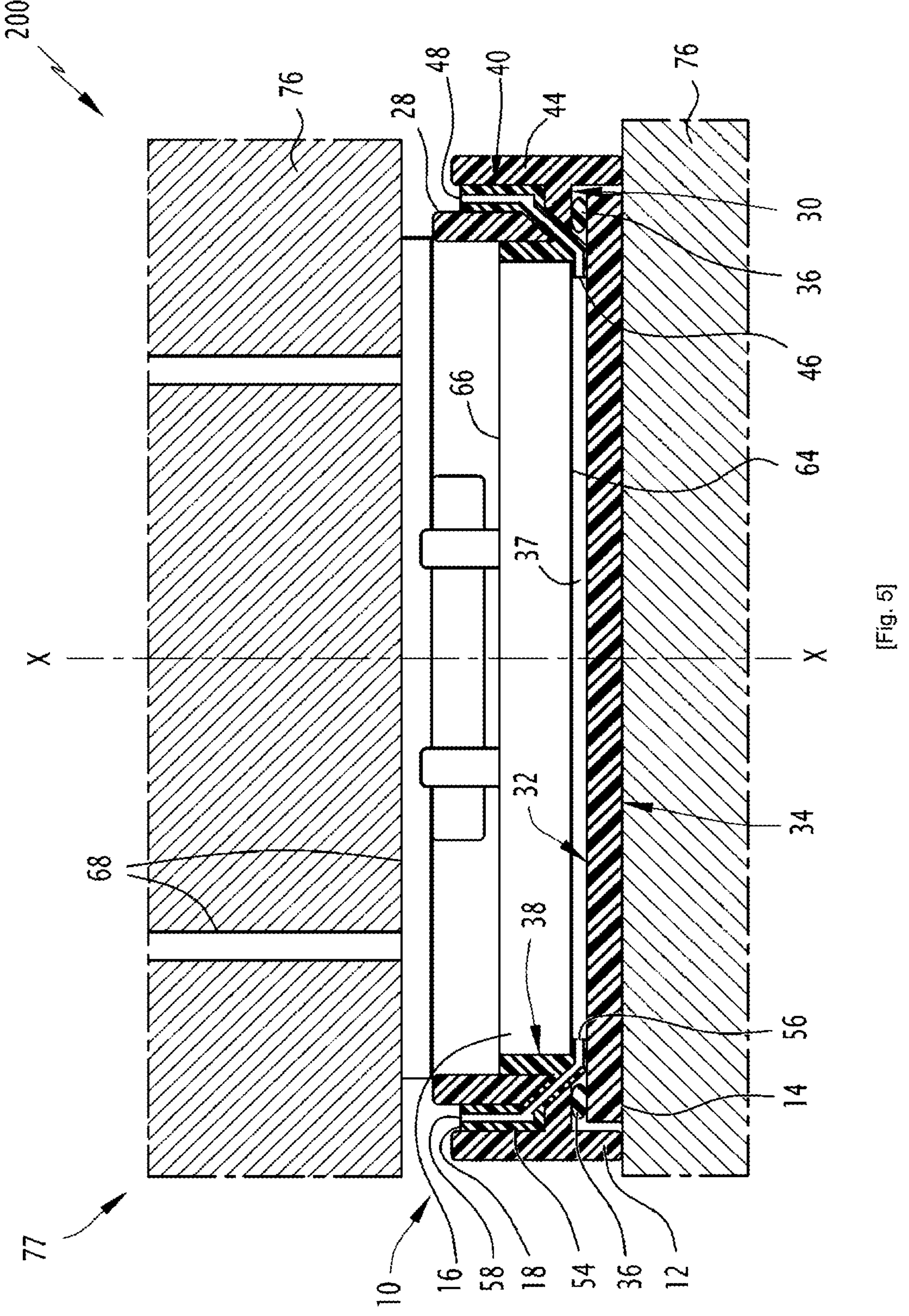
[Fig. 5]

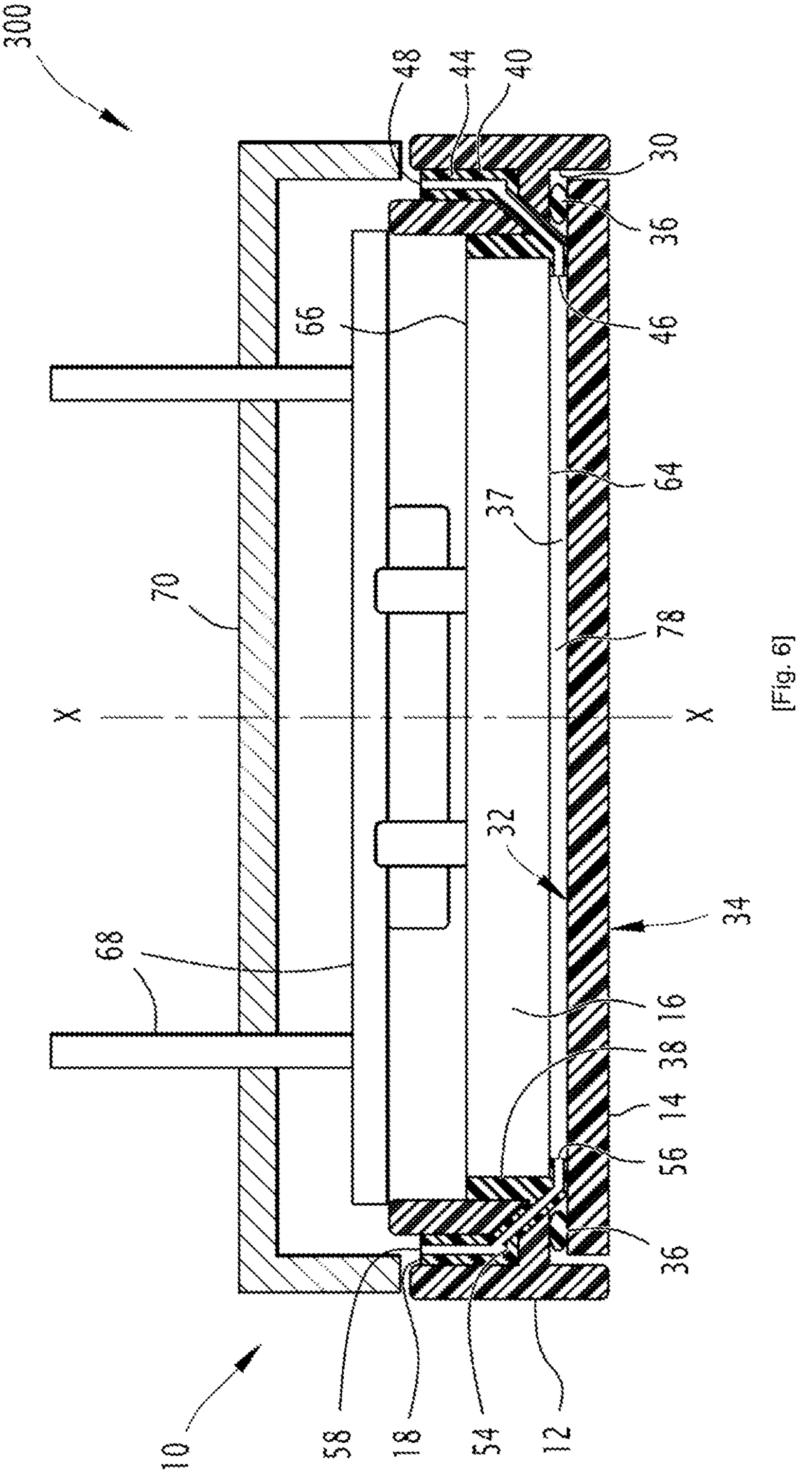
[Fig. 6]

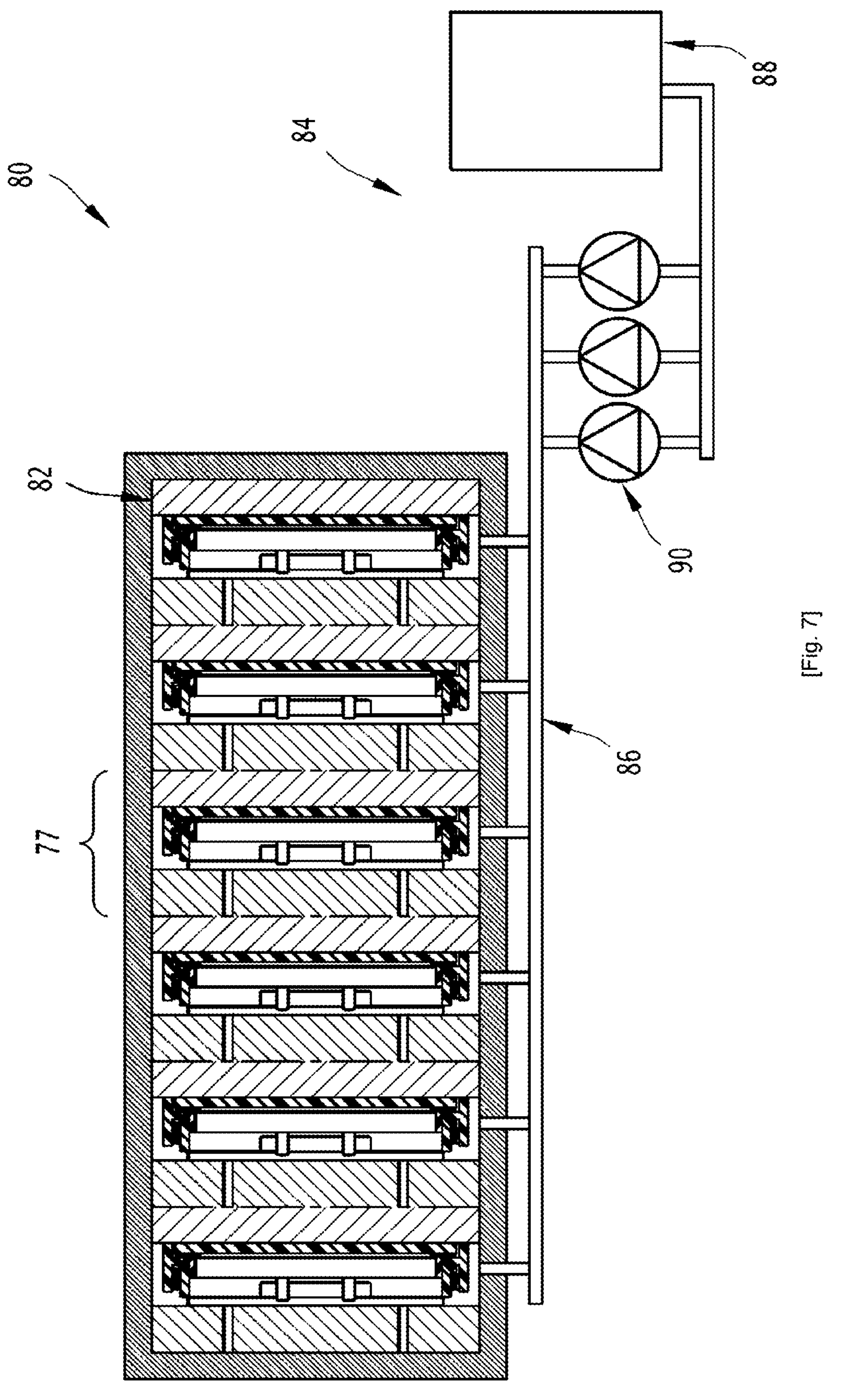
[Fig. 7]

METHOD FOR ASSEMBLING A DISPLAY DEVICE

TECHNICAL FIELD

The present invention relates to a method for assembling a display device.

BACKGROUND

In a display device, for example intended for the passenger compartment of a vehicle, it is known to attach the screen, or the panel, to a frame bearing a lens, forming the display surface of the display device, and to ensure the attachment of the screen to the lens and the transmission of light by an optical adhesive. The optical adhesive is for example activated and/or polymerized by heat, ultraviolet radiation or after a certain period of time. During this polymerization operation, the screen must be immobile relative to the lens and therefore relative to the frame in all directions. The screen must therefore be firmly attached to the frame. Such a firm and reversible attachment is for example obtained by screwing the screen onto the frame. However, such an attachment also applies significant stresses on the screen, which can cause defects in the display of images. Thus, such stresses are, for example, likely to generate a Mura effect on the display surface, thus degrading the quality of the images displayed.

To avoid these undesirable effects, a flexible attachment has been proposed in which adhesive elements ensure the adhesion of the screen to the frame. However, the assembly is not reversible.

SUMMARY

One of the aims of the invention is to propose a method for assembling and attaching a screen on a frame that ensures reliable, reversible immobilization on the frame of the screen and which applies no stress capable of generating display defects on the display surface of the display device.

To this end, the invention relates to an assembly method of the aforementioned type, wherein the method comprises the following successive steps:

- assembling a screen comprising a display face with a seal, thereby forming a central assembly;
- attaching a frame with a lens, thereby forming a front assembly;
- assembling the central assembly with the front assembly, the lens being positioned opposite the display face of the screen, the seal maintaining a sealed connection between the lens and the screen and forming a spacer maintaining a space between the screen and the lens, the seal comprising at least one injection opening comprising an internal orifice opening into the space and an external orifice adapted to receive an injector tip of a transparent adhesive; and
- injecting said transparent adhesive into the space through the injection opening.

This method for assembling the attaching device makes it possible to effectively lock the screen on the frame, and in particular to prevent a change in position of the screen relative to the frame, without however applying stresses on the screen. Indeed, these stresses are absorbed by the seal. Thus, the quality of the display on the display surface is preserved. Furthermore, by reducing the stresses applied on the screen, the risks of delamination of the optical bonding between the screen and the lens are reduced.

The assembly method according to the invention may comprise one or more of the following features, considered alone or in any technically conceivable combination:

- the seal is present over the entire periphery of the screen, and it creates a seal between the screen and the frame;
- the seal comprises lips over its entire periphery, positioned to be in contact with the screen;
- the frame comprises a support column, the seal forming a cylindrical portion surrounding the support column over the entire perimeter of the column, the injection opening being provided in the cylindrical portion;
- an injection valve located in proximity to the external orifice of the injection opening, the injection valve being suitable for allowing the passage of fluid only from the external orifice to the internal orifice;
- the seal further comprises an air vent passing through the seal, the air vent comprising an interior orifice opening into the space and an exterior opening;
- a vent valve located in proximity to the exterior orifice of the air vent, the vent valve being able to allow the passage of fluid only from the interior orifice toward the exterior orifice;
- the space is in only contact with the lens, the screen and the seal.

According to another aspect, the invention also relates to a display device comprising a screen, a frame and a lens, the lens being positioned opposite a display face of the screen, the frame surrounding the screen and the lens being attached to the frame, characterized in that the display device comprises a seal attached to the frame and to the screen, adapted to maintain a sealed connection between the lens and the screen and forming a spacer to maintain a space between the screen and the lens, the display device comprising at least one injection opening passing through the seal, the injection opening comprising an internal orifice opening into the space and an external orifice adapted to receive an injector tip of transparent adhesive, the space being adapted to receive a transparent adhesive.

According to other aspects, the invention also relates to a manufacturing assembly with several recesses each making it possible to receive a display device assembled with an assembly method, the manufacturing assembly comprising an injector device making it possible to inject the adhesive into each external orifice of each seal.

According to other aspects, the invention also relates to a method for manufacturing a plurality of display devices using a manufacturing assembly, the method comprising the following successive steps:

- positioning several display devices in the manufacturing assembly;
- connecting the injector device to each external orifice; and
- injecting adhesive into the space of each of the display devices by the external orifice of each seal.

BRIEF DESCRIPTION OF THE DRAWINGS

Other aspects and advantages of the invention will appear on reading the following description, given by way of example and made with reference to the appended drawings, wherein:

FIG. 1 is a partial sectional view of an injection opening of a display device assembled according to an assembly method embodiment of the invention, FIG. 2 is a partial sectional view of the injection opening of a display device according to another embodiment with an adhesive injector, FIG. 3 is a perspective view of the display device of FIG. 1;

FIG. 4 is a sectional view of the display device of FIG. 1 during a step of the assembly method, FIG. 5 is a sectional view of the display device of FIG. 1 during another step of the assembly method, FIG. 6 is a sectional view of the display device of FIG. 1 during yet another step of the assembly method, and FIG. 7 is a sectional view of a manufacturing assembly comprising a plurality of display devices of FIG. 1.

DETAILED DESCRIPTION

Referring to FIGS. 1 and 2, a display device 10 is described. The assembly process of such a display device 10 will be described below.

Such a display device 10 is for example intended to be mounted in the passenger compartment of a vehicle so as to display information related to the state of the vehicle and/or to the driving thereof and/or to display audiovisual content. The display device 10 is, for example, mounted onto a trim element of the passenger compartment, such as a dashboard, a door panel, a center console, a seat, an armrest, etc.

The display device 10 comprises a frame 12 and a lens 14, the lens 14 being attached to the frame 12. The display device 10 further comprises a screen 16 and a seal 18 attached to the frame 12 and to the screen 16.

The screen 16 is connected to the frame 12 by the seal 18, the seal 18 framing the screen 16 and the seal 18 is surrounded by the frame 12.

The lens 14 is positioned opposite a display face of the screen 16.

A shape of the frame 12 is shown in an example in FIG. 3, the frame 12 advantageously forming a rectangular ring surrounding the seal 18. The ring is centered on an elongation axis X-X substantially perpendicular to the plane in which the frame extends. The frame 12 thus defines an opening having a shape substantially complementary to the contour of the seal 18.

The frame 12 is arranged to receive the screen 16 and the seal 18 in said opening and to ensure the interface between the display device 10 and the environment of the display device 10 in the vehicle. In other words, the frame 12 is mounted on the trim element receiving the display device 10, for example in an opening of the trim element provided for this purpose.

The frame 12 advantageously comprises at least two locations, one projection 26 in an arc of a circle. As can be seen in FIG. 3, the projections 26 are each positioned in an angle of the rectangular frame 12.

The frame 12 also comprises at least two support columns 28, each advantageously positioned at the center of the arc of circle defining the projection 26 in a corner of the frame 12. The support column 28 is connected to the frame 12 at the base of the column, not shown in FIGS. 1 and 2.

The frame 12 comprises an attachment surface 30 with a closed contour, oriented orthogonally to the axis of elongation X-X. The lens 14 is positioned against the attachment surface 30.

The lens 14 extends mainly in a direction perpendicular to the direction of elongation X-X. The lens 14 comprises an interior face 32 oriented toward the screen 16 and an exterior face 34 opposite the interior face 32.

In an embodiment not shown, the interior face 32 of the lens 14 is curved.

The lens 14 is attached to the frame 12 using an adhesive 36 around the periphery and applied at least on a portion of the attachment surface 30 of the frame 12 and on an interior face 32 of the lens 14.

As can be seen in FIG. 1, the frame 12 follows the periphery of the lens 14 and the opening of the frame 12 has a shape substantially complementary to the lens 14. The lens 14 forms the display surface of the display device 10 and protects the screen 16, the lens 14 extending into the opening of the frame 12 and closing this opening.

The seal 18 is adapted to maintain a sealed connection between the screen 16 and the lens 14 and to form a spacer to maintain a space 37 between the screen 16 and the lens 14.

The seal 18 is a ring centered on the elongation axis X-X, made of deformable plastic material. The seal 18 comprises an inner contour 38 and an outer contour 40. The inner contour 38 is pressed against the peripheral edge of the screen and matches the shape thereof. The outer contour 40 is pressed against the inner surface of the frame 12 and therefore has a shape that corresponds to that of the opening of the frame 12.

The seal 18 comprises a cylindrical portion 42 able to conform to the shape of the gap between the support column 28 and the projection 26. As shown in FIG. 3, the seal 18 surrounds the support column 28 over the entire perimeter of the support column 28.

FIGS. 1 and 2 show a sectional view in which the base of the support column 28 is not visible and the cylindrical portion 42 is shown in place.

The seal 18 comprises at least one injection opening 44, advantageously provided in the cylindrical portion 42 of the seal 18. The injection opening 44 comprises an internal orifice 46 opening into the space 37 and an external orifice 48, the injection opening 44 passing through the seal 18. The injection opening 44 is thus of cylindrical shape seen in the plane of FIG. 3.

In one embodiment, visible in FIG. 1, the injection opening 44 has an angled shape. In another embodiment, visible in FIG. 2, the injection opening 44 has a straight shape.

The external orifice 48 is located at the distal end of the cylindrical portion 42 of the seal 18. The external orifice 48 is adapted to receive a transparent adhesive injector tip 50, as shown in FIG. 2.

The display device 10 further comprises an injection valve 52 located in proximity to the external orifice 48, in the injection opening 44. The injection valve 52 is able to allow the passage of fluid only from the external orifice 48 to the internal orifice 46.

In FIG. 1 the injection valve 52 is visible, but in FIG. 2 another embodiment without injection valve 52 is shown.

In one embodiment not shown, the injection opening 44 is split into two ducts passing through the seal 18 on each side of the support column 28.

The seal 18 also comprises an air vent 54, visible in FIG. 3 passing through the seal 18 and placing the space 37 in fluid communication with the outside. The air vent 54 is advantageously located opposite the injection opening 44 relative to the elongation axis X-X.

The air vent 54 comprises an interior orifice 56 opening onto the space 37 and an exterior orifice 58 opening into the environment of the display device.

Alternatively, the display device 10 further comprises a vent valve located near the exterior opening 58 in the air vent 54. The vent valve is able to allow the passage of fluid only from the interior orifice 56 to the exterior orifice 58.

The air vent 54 is similar to the injection opening 44, FIG. 1 showing the injection opening 44 or the air vent 54.

The inner contour 38 of the seal 18 has a shape substantially complementary to the contour of the screen 16. The seal 18 also comprises lips 62 located on its inner contour 38 that are able to ensure the sealing of the connection of the seal 18 to the screen 16. The lips 62 are visible in FIGS. 1 and 2, but in the position shown of the display device 10, the lips 62 are pressed between the seal 18 and the screen 16.

The seal 18 is present over the entire periphery of the screen 16, creating a seal between the screen 16 and the frame 12. The lips are also present on the entire inner contour 38 of the seal 18.

In one embodiment not shown, the seal 18 also comprises, on its outer contour 40, lips intended to be positioned against the frame 12.

The screen 16 extends mainly in a direction perpendicular to the direction of elongation X-X. The screen 16 is attached via the seal 18 to the frame 12. The screen 16 comprises an inner surface 64 opposite the lens 14 and an outer surface 66 opposite the inner surface 64.

The inner surface 64 is typically a display face of the screen.

In one embodiment not shown, the inner surface 64 of the screen 16 is curved.

The invention may be used in connection with different types of screens 16, such as an LCD (Liquid Crystal Display) or OLED (Organic Light-Emitting Diode) screen.

According to one embodiment, the screen 16 is a touch screen making it possible to control functions of the display device 10 and/or of the vehicle in which the display device 10 is mounted by digital contact with the display surface. To do this, a capacitive film is for example applied to the exterior face 34 of the lens 14.

In one embodiment, shown in FIG. 4, the screen is connected to a PCB (Printed Circuit Board) advantageously comprising a graphic microcontroller.

The space 37 provided between the lens 14 and the screen 16 is maintained at constant thickness using the seal 18. In other words, the respective positions of the lens and the screen relative to one another are kept unchanged by the seal.

In the case where the inner surface 64 of the screen 16 is curved or the interior face 32 of the lens 14 is curved, the space 37 is also kept constant throughout the assembly process described below.

The space 37 is advantageously delimited only by the lens 14, the screen 16 and the seal 18.

The display device 10 also comprises a reinforcement 68 shown in FIG. 2. The reinforcement 68 is attached to the frame 12 and to the screen 16 and ensures a connection with the external environment of the display device 10. The reinforcement 68 partially blocks the screen 16 along the direction of elongation X-X.

The display device 10 also comprises a shell 70 shown in FIG. 6, attached to the reinforcement 68. The shell 70 immobilizes the reinforcement 68 and therefore the screen 16 in the direction of elongation X-X. The shell 70 is positioned against a bottom of the trim element of the vehicle.

A liquid optical adhesive fills the space 37. It is injected through the injection opening (s) 44, as described below.

It completely fills the space 37.

The adhesive in particular covers the display face of the screen 16, and covers the interior face 32 of the lens 14. It contributes to holding the lens 14 in position relative to the screen 16.

The assembly method will now be described.

Beforehand, in a first step 100, the screen 16 and the seal 18 are assembled.

To do this, the screen 16 is inserted into the inner contour 38 of the seal 18. The lips 62 of the seal 18 are deformed to accommodate the screen 16.

The screen 16 and the seal 18 form a central assembly 72.

During this same step 100, the lens 14 is attached to the frame 12.

An adhesive 36 is applied at the periphery of at least part of the attachment surface 30, and the lens 14 is applied thereon.

The lens 14 and the frame 12 form a front assembly 74.

The central assembly 72 and the front assembly 74 are visible in FIG. 4.

In a following step 200, the central assembly 72 is assembled to the front assembly 74, the lens 14 being positioned opposite the display face of the screen 16.

The central assembly 72 is inserted in the direction of elongation X-X so that the seal 18 abuts against the lens 14. The seal 18 is placed on the frame 12, the cylindrical portions of the seal 18 surrounding the support columns 28 of the frame 12.

The seal 18 maintains a sealed connection between the lens 14 and the screen 16 and forms a spacer maintaining a space 37 between the screen 16 and the lens 14.

The seal 18 maintains a sealed connection between the screen 16 and the frame 12.

The reinforcement 68 is then attached to the frame 12 by means of the support columns 28, as shown in FIG. 5, or by abutting against the seal 18 as shown in FIG. 2.

Two jaws 76 are then applied on either side of the display device 10 along the direction of elongation X-X, ensuring an absence of movements along the direction of elongation X-X. The jaws 76 are visible in FIG. 5.

In a following step, a transparent adhesive 78 is injected through the injection opening 44 into the space 37.

To do this, the tip 50 of an adhesive injector is attached to the external orifice 48 of the injection opening 44 of the seal 18. Such an injector is partially shown in FIG. 2.

The two jaws 76 and the adhesive injector together form a manufacturing unit 77.

The jaws 76 firmly hold the display device 10 in place, the injector injects the transparent adhesive 78 through the injection opening 44 into the space 37.

The transparent adhesive 78 is for example a Liquid Optically Clear Adhesive (LOCA).

The transparent adhesive 78 fills the entirety of the space 37 and the injection opening 44. The air vent 54 is advantageously partially filled with the transparent adhesive 78. The injection valve 52 prevents the adhesive from escaping through the injection opening 44. The vent valve prevents the adhesive from escaping through the air vent 54, while allowing the transparent adhesive 78 to dry.

In a following step 300, when the transparent adhesive 78 is polymerized, the jaws 76 are removed from the display device 10 and the shell 70 is positioned on the reinforcement 68. The display device 10 is assembled, as can be seen in FIG. 6.

FIG. 7 shows a manufacturing assembly 80 of display devices. The manufacturing assembly 80 comprises several recesses 82 each enabling a display device 10 to be received, as assembled with the assembly method described above.

Each recess 82 receives a manufacturing unit 77 in which the display device is received. The latter comprises the screen 16, the frame 12, the seal 18 and the lens 14 already assembled together (situation of FIG. 1).

The manufacturing assembly 80 also comprises an injector device 84 allowing adhesive to be injected into each external orifice 48 of each seal 18.

This injector device 84 comprises a plurality of ducts 86 and a reservoir 88 of transparent adhesive 78, the plurality of ducts connecting the reservoir 88 to the adhesive injectors of each manufacturing unit 77.

The injector device 84 also comprises a plurality of pumps 90 positioned on the ducts 86. Valves, not shown, are present upstream of the external orifice 48 of each seal 18.

The corresponding manufacturing method is now briefly described.

In a first step, several display devices 10 are positioned in the manufacturing assembly 80.

More precisely, they are each positioned in a manufacturing unit 77.

In a second step, the injector device 84 is connected to the external orifices 48 of each display device 10.

To do this, the tips 50 of the adhesive injectors are engaged in the external orifices 48 of the injection openings 44.

Thus, the ducts 86 are connected to the external orifices of the seals.

In a third step, transparent adhesive 78 is injected from the reservoir 88 into the space 37 of each of the manufacturing units. Once the transparent adhesive 78 is polymerized, the manufacturing unit 77 is removed from the recesses 82 of the manufacturing assembly 80.

The assembly method has multiple advantages.

The presence of the seal 18 makes it possible to maintain a constant space 37 between the lens 14 and the screen 16 during the polymerization of the adhesive, while absorbing the impacts thanks to its deformable plastic composition The shape of the seal 18 is adaptable to the shape of the screen 16 and is functional even in the case of a screen 16 having a curved inner surface 64. Regardless of the shape of the space 37, the seal 18 makes it possible to maintain a constant distance between the screen 16 and the lens 14.

Since the seal 18 is simple and cheap to manufacture, the assembly method is thus simplified and inexpensive.

The assembly method also comprises few steps and is easy to set up.

The placement of the injection opening 44 on one end of the seal 18 allows easy access to the space 37 and facilitates a connection with the transparent adhesive injector tip 50.

The seal 18 surrounds the entire screen 16 and provides lips 62 over its entire inner contour 38, ensuring the seal between the screen 16 and the frame 12 without transmission of mechanical forces.

The presence of a support column 28 allows the seal 18 to be attached to the frame 12 easily and quickly.

The injection valve 52 prevents the transparent adhesive 78 from flowing out of the injection opening 44 during the drying of the adhesive. The vent valve prevents the transparent adhesive 78 from flowing out of the air vent 54 during the polymerization of the adhesive.

The air vent 54 is positioned opposite the injection opening 44 in order to precisely meter the transparent adhesive 78 to be injected into the space 37, the transparent adhesive 78 first filling the space 37 without rising directly into the air vent 54.

The space 37 intended to receive the transparent adhesive 78 is in contact only with the screen 16 and the lens 14, which are the elements that are to be bonded together, but also with the seal 18 ensuring the space 37 between the screen 16 and the lens 14.

The manufacturing assembly 80 and the manufacturing method make it possible to have a modular manufacturing mode, simple to use while manufacturing a larger number of display devices 10 simultaneously. Since the drying time of each manufacturing unit 77 is similar, the time of a manufacturing cycle of a display device 10 is thus optimized.

The invention claimed is:

1. A method for assembling a display device, wherein the method comprises the following steps:

assembling a screen comprising a display face with a seal thereby forming a central assembly;

attaching a frame with a lens, thereby forming a front assembly;

assembling the central assembly with the front assembly, the lens being positioned opposite the display face of the screen, the seal maintaining a sealed connection between the lens and the screen and forming a spacer maintaining a space between the screen and the lens, the seal comprising at least one injection opening comprising an internal orifice opening into the space and an external orifice adapted to receive an injector tip of a transparent adhesive, wherein the display device further comprises an injection valve located in proximity to the external orifice of the injection opening, the injection valve being able to allow the passage of fluid only from the external orifice to the internal orifice; and injecting said transparent adhesive into the space through the injection opening.

2. The assembly method according to claim 1, wherein the seal is present over the entire periphery of the screen and creates a seal between the screen and the frame.

3. The assembly method according to claim 2, wherein the seal comprises lips over its entire periphery, positioned to be in contact with the screen.

4. The assembly method according to claim 1, wherein the frame comprising a support column, the seal forming a cylindrical portion surrounding the support column over the entire perimeter of the column, the injection opening being provided in the cylindrical portion.

5. The assembly method according to claim 1, wherein the seal further comprises an air vent passing through the seal, the air vent comprising an interior orifice opening onto the space and an exterior orifice.

6. The assembly method according to claim 5, further comprising a vent valve located in proximity to the exterior orifice of the air vent, the vent valve being able to allow the passage of fluid only from the interior orifice to the exterior orifice.

7. The assembly method according to claim 1, wherein the space is in contact only with the lens, the screen and the seal.

8. A manufacturing assembly with several recesses each enabling receipt of a display device constructed and assembled according to the assembly method of claim 1, the manufacturing assembly comprising an injector device enabling the adhesive to be injected into each external orifice of each seal.

9. A method of manufacturing a plurality of display devices using a manufacturing assembly according to claim 8, the method comprising the following steps:

positioning several display devices in the manufacturing assembly;

connecting the injector device to each external orifice; and injecting adhesive into the space of each of the display devices through the external orifice of each seal.

10. A display device comprising a screen, a frame and a lens, the lens being positioned opposite a display face of the screen, the frame surrounding the screen and the lens being attached to the frame, wherein the display device comprises a seal attached to the frame and to the screen, adapted to maintain a sealed connection between the lens and the screen and forming a spacer to maintain a space between the screen and the lens, the display device comprising at least one injection opening passing through the seal, the injection opening comprising an internal orifice opening into the space and an external orifice adapted to receive a transparent adhesive injector tip, the space being adapted to receive a transparent adhesive, wherein the display device further comprises an injection valve located in proximity to the external orifice of the injection opening, the injection valve being able to allow the passage of fluid only from the external orifice to the internal orifice.

* * * * *